(12) United States Patent
Huang et al.

(10) Patent No.: US 11,121,900 B2
(45) Date of Patent: Sep. 14, 2021

(54) DISCRETE FOURIER TRANSFORM SIZE DECOMPOSITION

(71) Applicant: QUALCOMM Incorporated, San Diego, CA (US)

(72) Inventors: Yi Huang, San Diego, CA (US); Peter Gaal, San Diego, CA (US); Xiao Feng Wang, San Diego, CA (US); Wanshi Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/834,421

(22) Filed: Mar. 30, 2020

(65) Prior Publication Data

US 2020/0351138 A1    Nov. 5, 2020

Related U.S. Application Data

(60) Provisional application No. 62/843,026, filed on May 3, 2019.

(51) Int. Cl.
*H04L 27/26* (2006.01)
*H04B 1/711* (2011.01)
(Continued)

(52) U.S. Cl.
CPC ........ *H04L 27/2636* (2013.01); *G06F 17/141* (2013.01); *G06F 17/18* (2013.01);
(Continued)

(58) Field of Classification Search
CPC . H04L 27/2636; H04L 27/263; H04L 5/0023; H04L 5/0046; H04L 5/0062;
(Continued)

(56) References Cited

U.S. PATENT DOCUMENTS

2006/0193393 A1* 8/2006 Shen ................... H04L 27/2621
                                                                 375/260
2011/0090987 A1* 4/2011 Jeong ................... H04L 1/0042
                                                                 375/295
(Continued)

OTHER PUBLICATIONS

Ida Yuta., et al., "Antenna Interleaved Allocation with FSS and Divided FFT Spreading for MIMO-OFDM," 2018 International Symposium on Intelligent Signal Processing and Communication Systems (ISPACS). IEEE, Nov. 27, 2018 (Nov. 27, 2018), pp. 372-377. XP033644445, DOI:10.1109/ISPACS.2018.8923328 [retrieved on Dec. 4, 2019] figures 1.2 section III.

(Continued)

*Primary Examiner* — Jean B Corrielus
(74) *Attorney, Agent, or Firm* — QUALCOMM Incorporated

(57) ABSTRACT

Various aspects of the present disclosure generally relate to wireless communication. In some aspects, a user equipment (UE) may determine, based at least in part on a decomposition rule for a discrete Fourier transform (DFT) block, a plurality of decomposition groups for tones, corresponding to a plurality of antenna ports of the UE, of a transmission. The UE may map the tones to the plurality of decomposition groups for transmission processing, and transmit, using the plurality of antenna ports, the transmission based at least in part on transmission processing. Numerous other aspects are provided.

30 Claims, 9 Drawing Sheets

(51) Int. Cl.
*G06F 17/18* (2006.01)
*H03F 3/20* (2006.01)
*G06F 17/14* (2006.01)
*H04B 7/04* (2017.01)

(52) U.S. Cl.
CPC ............... *H03F 3/20* (2013.01); *H04B 1/711* (2013.01); *H04B 7/04* (2013.01)

(58) Field of Classification Search
CPC   H04B 1/711; H04B 7/04; G06F 17/18; G06F 17/141; H03F 3/20; H04J 11/003
See application file for complete search history.

(56) References Cited

U.S. PATENT DOCUMENTS

| | | | | |
|---|---|---|---|---|
| 2011/0299383 | A1* | 12/2011 | Ko | H04B 7/0613 |
| | | | | 370/210 |
| 2013/0094344 | A1* | 4/2013 | Zhang | H04L 27/2634 |
| | | | | 370/208 |
| 2015/0350388 | A1* | 12/2015 | Bae | H04L 25/0204 |
| | | | | 370/474 |
| 2017/0310439 | A1* | 10/2017 | Yang | H04L 27/0006 |
| 2017/0373738 | A1 | 12/2017 | Chae et al. | |
| 2020/0244503 | A1* | 7/2020 | Bala | H04L 5/0007 |

OTHER PUBLICATIONS

International Search Report and Written Opinion—PCT/US2020/025947—ISA/EPO—dated Sep. 8, 2020.
Nokia Siemens Networks., et al., "PUCCH Format 3 Transmit Diversity Performance Evaluation," 3GPP Draft, 3GPP TSG RAN WG1 Meeting #62bis, R1-105538, 3rd Generation Partnership Project (3GPP), Mobile Competence Centre, 650, Route Des Lucioles, F-06921, Sophia-Antipolis Cedex, France, vol. RAN WG1. No. Xi'an, Oct. 11, 2010-Oct. 15, 2010, Oct. 5, 2010 (Oct. 5, 2010), XP050450646, 5 pages, [retrieved on Oct. 5, 2010] figure 2.

* cited by examiner

DISCRETE FOURIER TRANSFORM SIZE DECOMPOSITION

CROSS-REFERENCE TO RELATED APPLICATION

This Patent Application claims priority to U.S. Provisional Application No. 62/843,026, filed on May 3, 2019, entitled "DISCRETE FOURIER TRANSFORM SIZE DECOMPOSITION," and assigned to the assignee hereof. The disclosure of the prior Application is considered part of and is incorporated by reference in this Patent Application.

FIELD OF THE DISCLOSURE

Aspects of the present disclosure generally relate to wireless communication and to techniques and apparatuses for discrete Fourier transform size decomposition.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, and/or the like.

The above multiple access technologies have been adopted in various telecommunication standards to provide a common protocol that enables different user equipment to communicate on a municipal, national, regional, and even global level. New Radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

SUMMARY

In some aspects, a method of wireless communication, performed by a user equipment (UE), may include determining, based at least in part on a decomposition rule for a discrete Fourier transform (DFT) block, a plurality of decomposition groups for tones, corresponding to a plurality of antenna ports of the UE, of a transmission, wherein respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion; mapping the tones to the plurality of decomposition groups for transmission processing; and transmitting, using the plurality of antenna ports, the transmission based at least in part on transmission processing.

In some aspects, a UE for wireless communication may include memory and one or more processors operatively coupled to the memory. The memory and the one or more processors may be configured to determine, based at least in part on a decomposition rule for a DFT block, a plurality of decomposition groups for tones, corresponding to a plurality of antenna ports of the UE, of a transmission, wherein respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion; map the tones to the plurality of decomposition groups for transmission processing; and transmit, using the plurality of antenna ports, the transmission based at least in part on transmission processing.

In some aspects, a non-transitory computer-readable medium may store one or more instructions for wireless communication. The one or more instructions, when executed by one or more processors of a UE, may cause the one or more processors to: determine, based at least in part on a decomposition rule for a DFT block, a plurality of decomposition groups for tones, corresponding to a plurality of antenna ports of the UE, of a transmission, wherein respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion; map the tones to the plurality of decomposition groups for transmission processing; and transmit, using the plurality of antenna ports, the transmission based at least in part on transmission processing.

In some aspects, an apparatus for wireless communication may include means for determining, based at least in part on a decomposition rule for a DFT block, a plurality of decomposition groups for tones, corresponding to a plurality of antenna ports of the apparatus, of a transmission, wherein respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion; means for mapping the tones to the plurality of decomposition groups for transmission processing; and means for transmitting, using the plurality of antenna ports, the transmission based at least in part on transmission processing.

Aspects generally include a method, apparatus, system, computer program product, non-transitory computer-readable medium, user equipment, base station, wireless communication device, and processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based at least in part on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with 3G and/or 4G wireless technologies, aspects of the present disclosure can be applied in other generation-based communication systems, such as 5G and later, including NR technologies.

Figure 1:
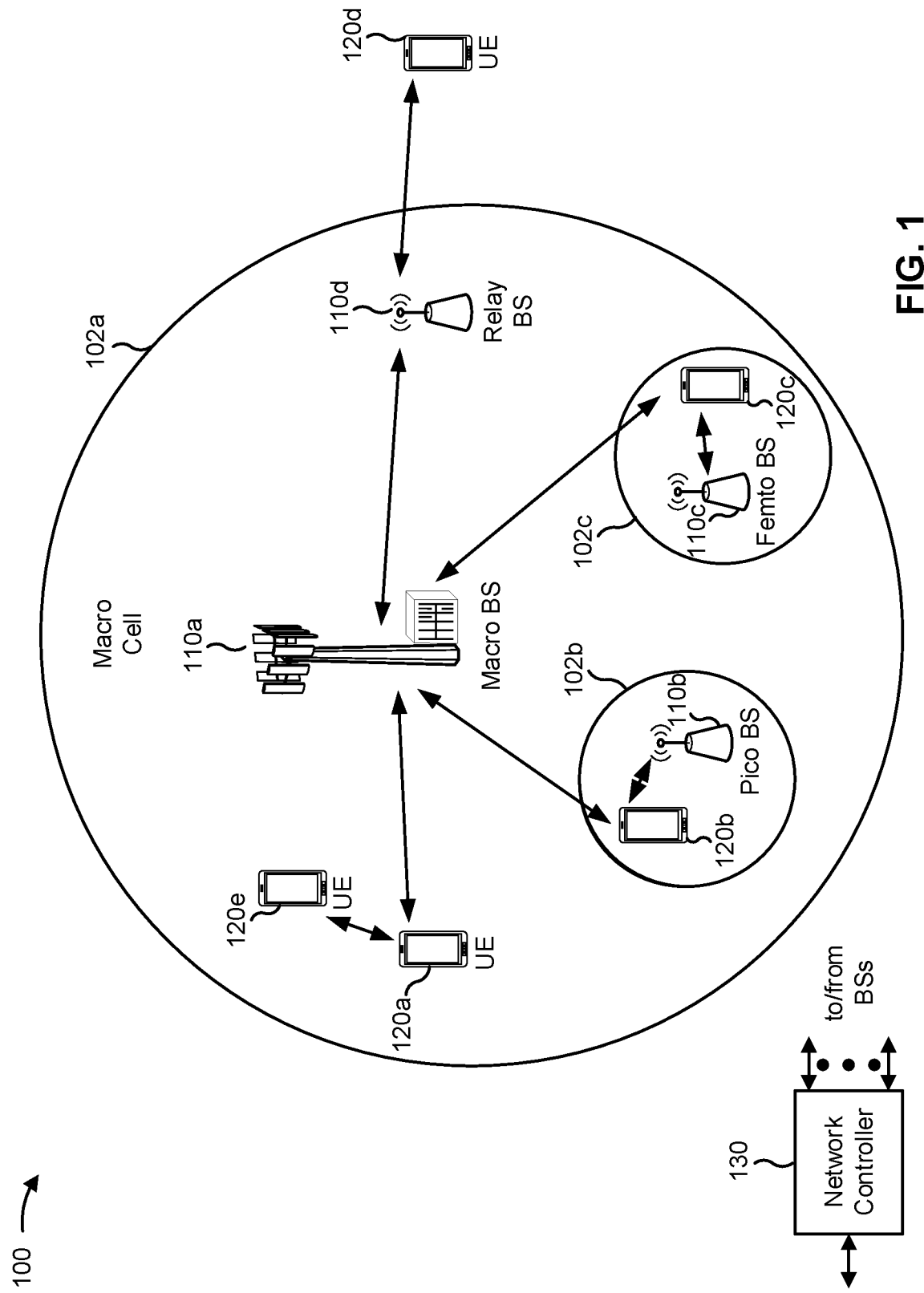
FIG. 1 is a block diagram conceptually illustrating an example of a wireless communication network, in accordance with various aspects of the present disclosure.

FIG. 1 is a diagram illustrating a wireless network 100 in which aspects of the present disclosure may be practiced. The wireless network 100 may be an LTE network or some other wireless network, such as a 5G or NR network. The wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impacts on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided as an example. Other examples may differ from what is described with regard to FIG. 1.

Figure 2:
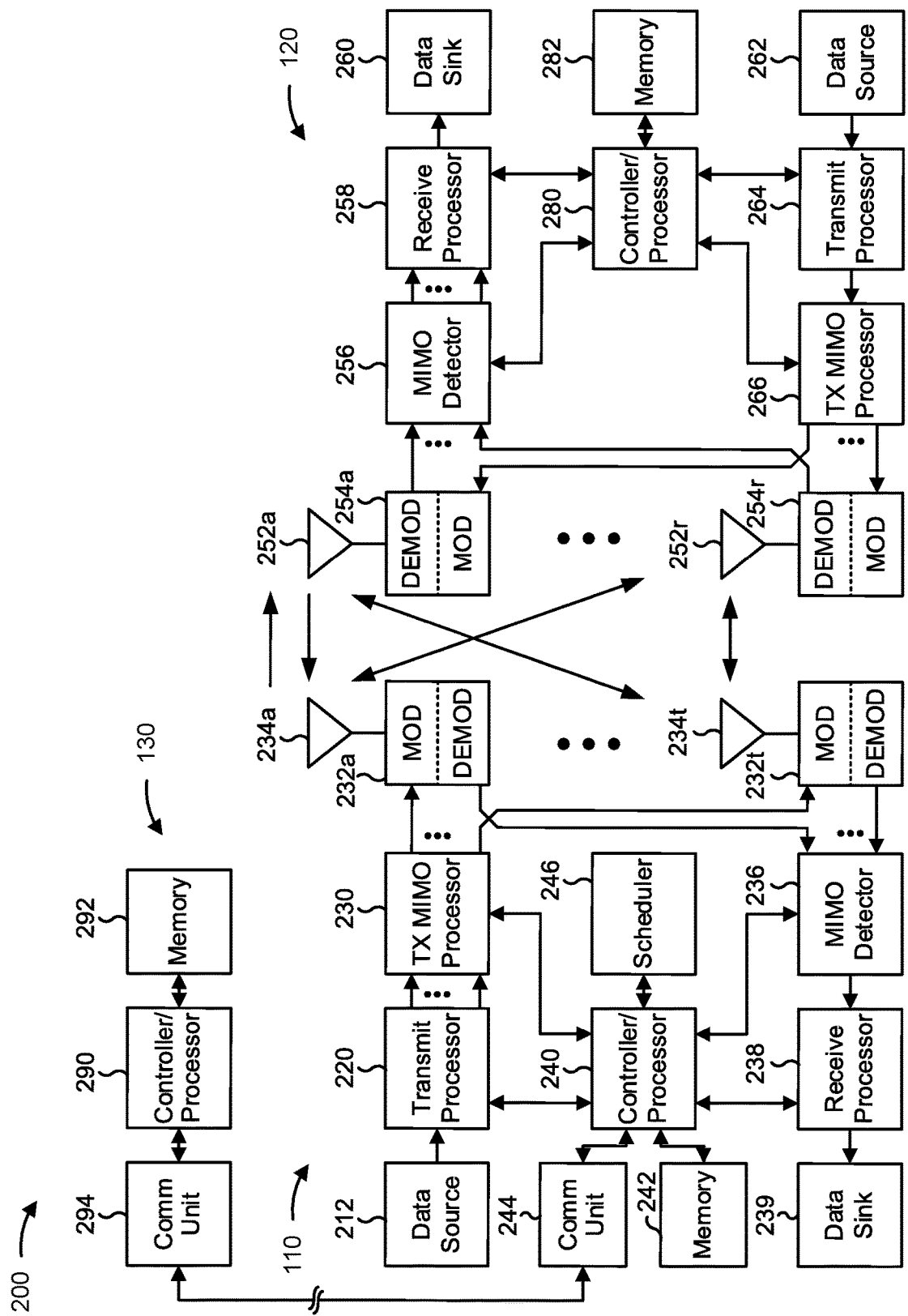
FIG. 2 is a block diagram conceptually illustrating an example of a base station in communication with a UE in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of UE 120 may be included in a housing.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Controller/processor 240 of base station 110, controller/processor 280 of UE 120, and/or any other component(s) of FIG. 2 may perform one or more techniques associated with discrete Fourier transform size decomposition, as described in more detail elsewhere herein. For example, controller/processor 240 of base station 110, controller/processor 280 of UE 120, and/or any other component(s) of FIG. 2 may perform or direct operations of, for example, process 800 of FIG. 8 and/or other processes as described herein. Memories 242 and 282 may store data and program codes for base station 110 and UE 120, respectively. A scheduler 246 may schedule UEs for data transmission on the downlink and/or uplink.

In some aspects, UE 120 may include means for determining, based at least in part on a decomposition rule for a discrete Fourier transform (DFT) block, a plurality of decomposition groups for tones, corresponding to a plurality of antenna ports of the UE, of a transmission, means for mapping the tones to the plurality of decomposition groups for transmission processing, means for transmitting, using the plurality of antenna ports, the transmission based at least in part on transmission processing, and/or the like. In some aspects, such means may include one or more components of UE 120 described in connection with FIG. 2.

As indicated above, FIG. 2 is provided as an example. Other examples may differ from what is described with regard to FIG. 2.

Figure 3A:
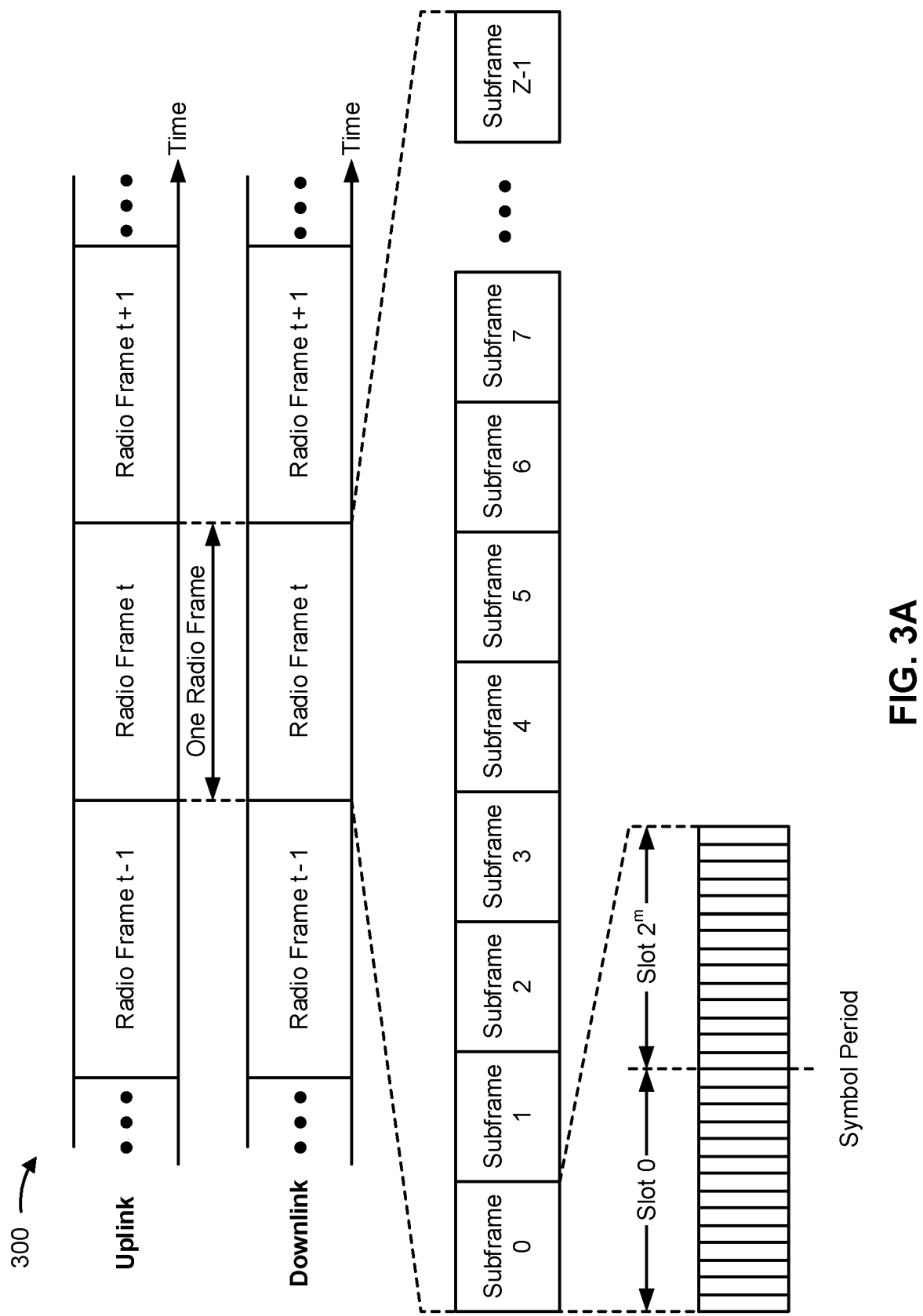
FIG. 3A is a block diagram conceptually illustrating an example of a frame structure in a wireless communication network, in accordance with various aspects of the present disclosure.

FIG. 3A shows an example frame structure 300 for frequency division duplexing (FDD) in a telecommunications system (e.g., NR). The transmission timeline for each of the downlink and uplink may be partitioned into units of radio frames (sometimes referred to as frames). Each radio frame may have a predetermined duration (e.g., 10 milliseconds (ms)) and may be partitioned into a set of Z (Z≥1) subframes (e.g., with indices of 0 through Z−1). Each subframe may have a predetermined duration (e.g., 1 ms) and may include a set of slots (e.g., $2^m$ slots per subframe are shown in FIG. 3A, where m is a numerology used for a transmission, such as 0, 1, 2, 3, 4, and/or the like). Each slot may include a set of L symbol periods. For example, each slot may include fourteen symbol periods (e.g., as shown in FIG. 3A), seven symbol periods, or another number of symbol periods. In a case where the subframe includes two slots (e.g., when m=1), the subframe may include 2 L symbol periods, where the 2 L symbol periods in each subframe may be assigned indices of 0 through 2 L−1. In some aspects, a scheduling unit for the FDD may be frame-based, subframe-based, slot-based, symbol-based, and/or the like.

While some techniques are described herein in connection with frames, subframes, slots, and/or the like, these techniques may equally apply to other types of wireless communication structures, which may be referred to using terms other than "frame," "subframe," "slot," and/or the like in 5G NR. In some aspects, a wireless communication structure may refer to a periodic time-bounded communication unit defined by a wireless communication standard and/or protocol. Additionally, or alternatively, different configurations of wireless communication structures than those shown in FIG. 3A may be used.

In certain telecommunications (e.g., NR), a base station may transmit synchronization signals. For example, a base station may transmit a primary synchronization signal (PSS), a secondary synchronization signal (SSS), and/or the like, on the downlink for each cell supported by the base station. The PSS and SSS may be used by UEs for cell search and acquisition. For example, the PSS may be used by UEs to determine symbol timing, and the SSS may be used by UEs to determine a physical cell identifier, associated with the base station, and frame timing. The base station may also transmit a physical broadcast channel (PBCH). The PBCH may carry some system information, such as system information that supports initial access by UEs.

In some aspects, the base station may transmit the PSS, the SSS, and/or the PBCH in accordance with a synchronization communication hierarchy (e.g., a synchronization signal (SS) hierarchy) including multiple synchronization communications (e.g., SS blocks), as described below in connection with FIG. 3B.

Figure 3B:
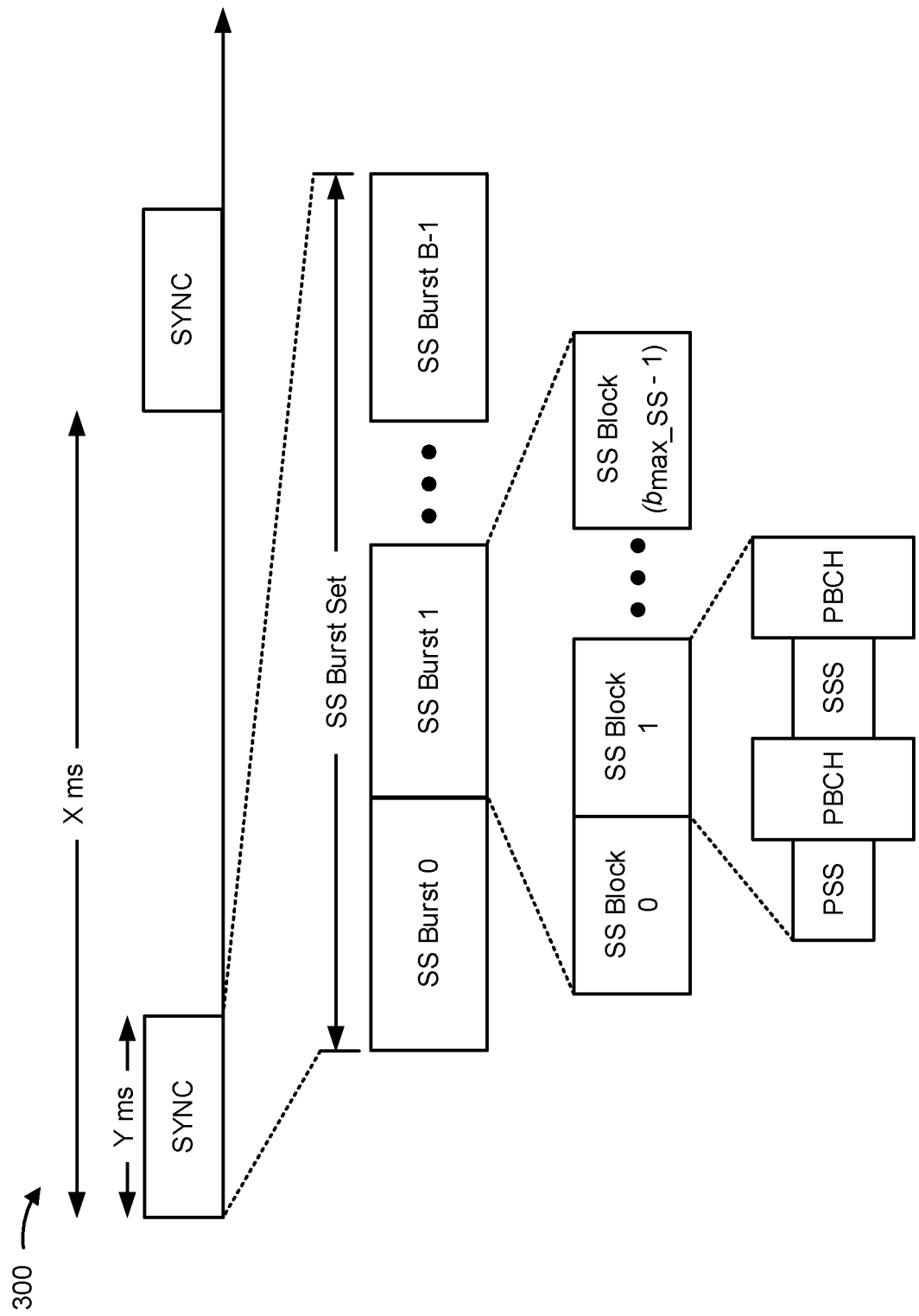
FIG. 3B is a block diagram conceptually illustrating an example synchronization communication hierarchy in a wireless communication network, in accordance with various aspects of the present disclosure.

FIG. 3B is a block diagram conceptually illustrating an example SS hierarchy, which is an example of a synchronization communication hierarchy. As shown in FIG. 3B, the SS hierarchy may include an SS burst set, which may include a plurality of SS bursts (identified as SS burst 0 through SS burst B-1, where B is a maximum number of repetitions of the SS burst that may be transmitted by the base station). As further shown, each SS burst may include one or more SS blocks (identified as SS block 0 through SS block ($b_{max\_SS}-1$), where $b_{max\_SS}-1$ is a maximum number of SS blocks that can be carried by an SS burst). In some aspects, different SS blocks may be beam-formed differently. An SS burst set may be periodically transmitted by a wireless node, such as every X milliseconds, as shown in FIG. 3B. In some aspects, an SS burst set may have a fixed or dynamic length, shown as Y milliseconds in FIG. 3B.

The SS burst set shown in FIG. 3B is an example of a synchronization communication set, and other synchronization communication sets may be used in connection with the techniques described herein. Furthermore, the SS block shown in FIG. 3B is an example of a synchronization communication, and other synchronization communications may be used in connection with the techniques described herein.

In some aspects, an SS block includes resources that carry the PSS, the SSS, the PBCH, and/or other synchronization signals (e.g., a tertiary synchronization signal (TSS)) and/or synchronization channels. In some aspects, multiple SS blocks are included in an SS burst, and the PSS, the SSS, and/or the PBCH may be the same across each SS block of the SS burst. In some aspects, a single SS block may be included in an SS burst. In some aspects, the SS block may be at least four symbol periods in length, where each symbol carries one or more of the PSS (e.g., occupying one symbol), the SSS (e.g., occupying one symbol), and/or the PBCH (e.g., occupying two symbols).

In some aspects, the symbols of an SS block are consecutive, as shown in FIG. 3B. In some aspects, the symbols of an SS block are non-consecutive. Similarly, in some aspects, one or more SS blocks of the SS burst may be transmitted in consecutive radio resources (e.g., consecutive symbol periods) during one or more slots. Additionally, or alternatively, one or more SS blocks of the SS burst may be transmitted in non-consecutive radio resources.

In some aspects, the SS bursts may have a burst period, whereby the SS blocks of the SS burst are transmitted by the base station according to the burst period. In other words, the SS blocks may be repeated during each SS burst. In some aspects, the SS burst set may have a burst set periodicity, whereby the SS bursts of the SS burst set are transmitted by the base station according to the fixed burst set periodicity. In other words, the SS bursts may be repeated during each SS burst set.

The base station may transmit system information, such as system information blocks (SIBs) on a physical downlink shared channel (PDSCH) in certain slots. The base station may transmit control information/data on a physical downlink control channel (PDCCH) in C symbol periods of a slot, where B may be configurable for each slot. The base station may transmit traffic data and/or other data on the PDSCH in the remaining symbol periods of each slot.

As indicated above, FIGS. 3A and 3B are provided as examples. Other examples may differ from what is described with regard to FIGS. 3A and 3B.

Figure 4:
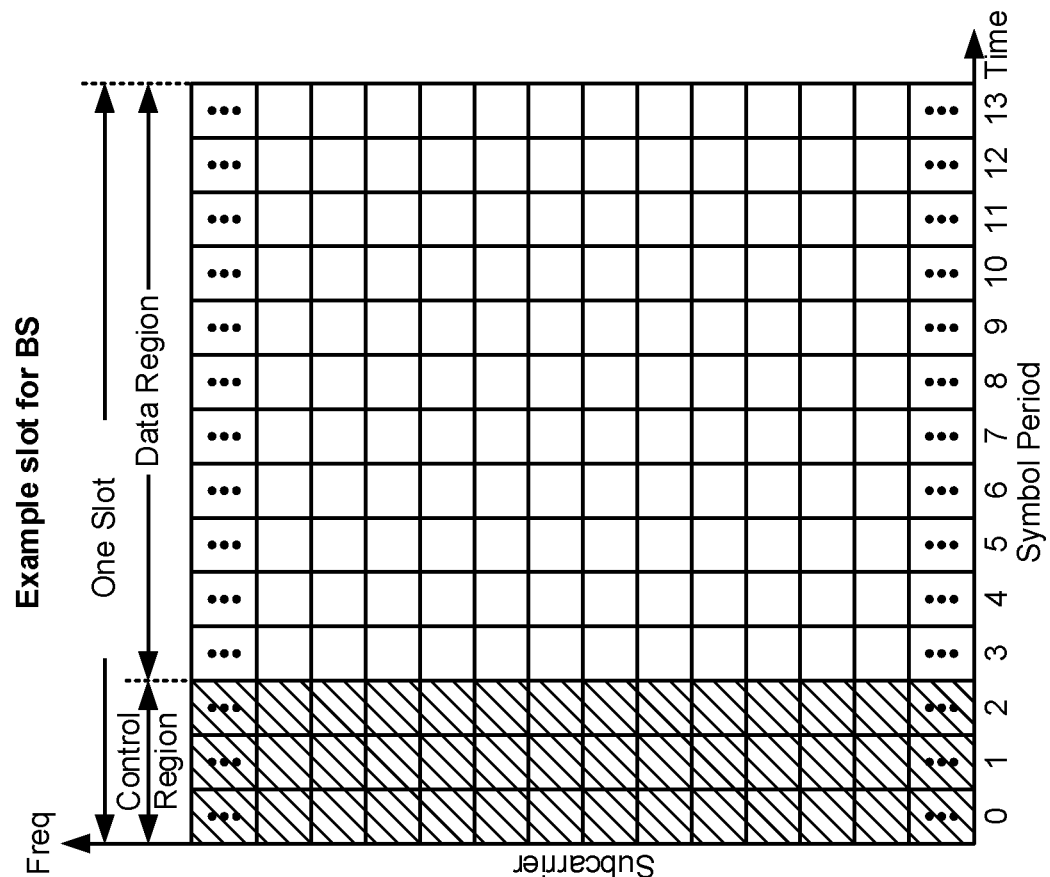
FIG. 4 is a block diagram conceptually illustrating an example slot format with a normal cyclic prefix, in accordance with various aspects of the present disclosure.

FIG. 4 shows an example slot format 410 with a normal cyclic prefix. The available time frequency resources may be partitioned into resource blocks. Each resource block may cover a set of subcarriers (e.g., 12 subcarriers) in one slot and may include a number of resource elements. Each resource element may cover one subcarrier in one symbol period (e.g., in time) and may be used to send one modulation symbol, which may be a real or complex value.

An interlace structure may be used for each of the downlink and uplink for FDD in certain telecommunications systems (e.g., NR). For example, Q interlaces with indices of 0 through Q-1 may be defined, where Q may be equal to 4, 6, 8, 10, or some other value. Each interlace may include slots that are spaced apart by Q frames. In particular, interlace q may include slots q, q+Q, q+2Q, etc., where $q \in \{0, \ldots, Q-1\}$.

A UE may be located within the coverage of multiple BSs. One of these BSs may be selected to serve the UE. The serving BS may be selected based at least in part on various criteria such as received signal strength, received signal quality, path loss, and/or the like. Received signal quality may be quantified by a signal-to-noise-and-interference ratio (SNIR), or a reference signal received quality (RSRQ), or some other metric. The UE may operate in a dominant interference scenario in which the UE may observe high interference from one or more interfering BSs.

While aspects of the examples described herein may be associated with NR or 5G technologies, aspects of the present disclosure may be applicable with other wireless communication systems. New Radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). In aspects, NR may utilize OFDM with a CP (herein referred to as cyclic prefix OFDM or CP-OFDM) and/or SC-FDM on the uplink, may utilize CP-OFDM on the downlink and include support for half-duplex operation using time division duplexing (TDD). In aspects, NR may, for example, utilize OFDM with a CP (herein referred to as CP-OFDM) and/or discrete Fourier transform spread orthogonal frequency-division multiplexing (DFT-s-OFDM) on the uplink, may utilize CP-OFDM on the downlink and include support for half-duplex operation using TDD. NR may include Enhanced Mobile Broadband (eMBB) service targeting wide bandwidth (e.g., 80 megahertz (MHz) and beyond), millimeter wave (mmW) targeting high carrier frequency (e.g., 60 gigahertz (GHz)), massive MTC (mMTC) targeting non-backward compatible MTC techniques, and/or mission critical targeting ultra reliable low latency communications (URLLC) service.

In some aspects, a single component carrier bandwidth of 100 MHz may be supported. NR resource blocks may span 12 sub-carriers with a sub-carrier bandwidth of 60 or 120 kilohertz (kHz) over a 0.1 millisecond (ms) duration. Each radio frame may include 40 slots and may have a length of 10 ms. Consequently, each slot may have a length of 0.25 ms. Each slot may indicate a link direction (e.g., DL or UL)

for data transmission and the link direction for each slot may be dynamically switched. Each slot may include DL/UL data as well as DL/UL control data.

Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based interface. NR networks may include entities such as central units or distributed units.

As indicated above, FIG. 4 is provided as an example. Other examples may differ from what is described with regard to FIG. 4.

Figure 5:
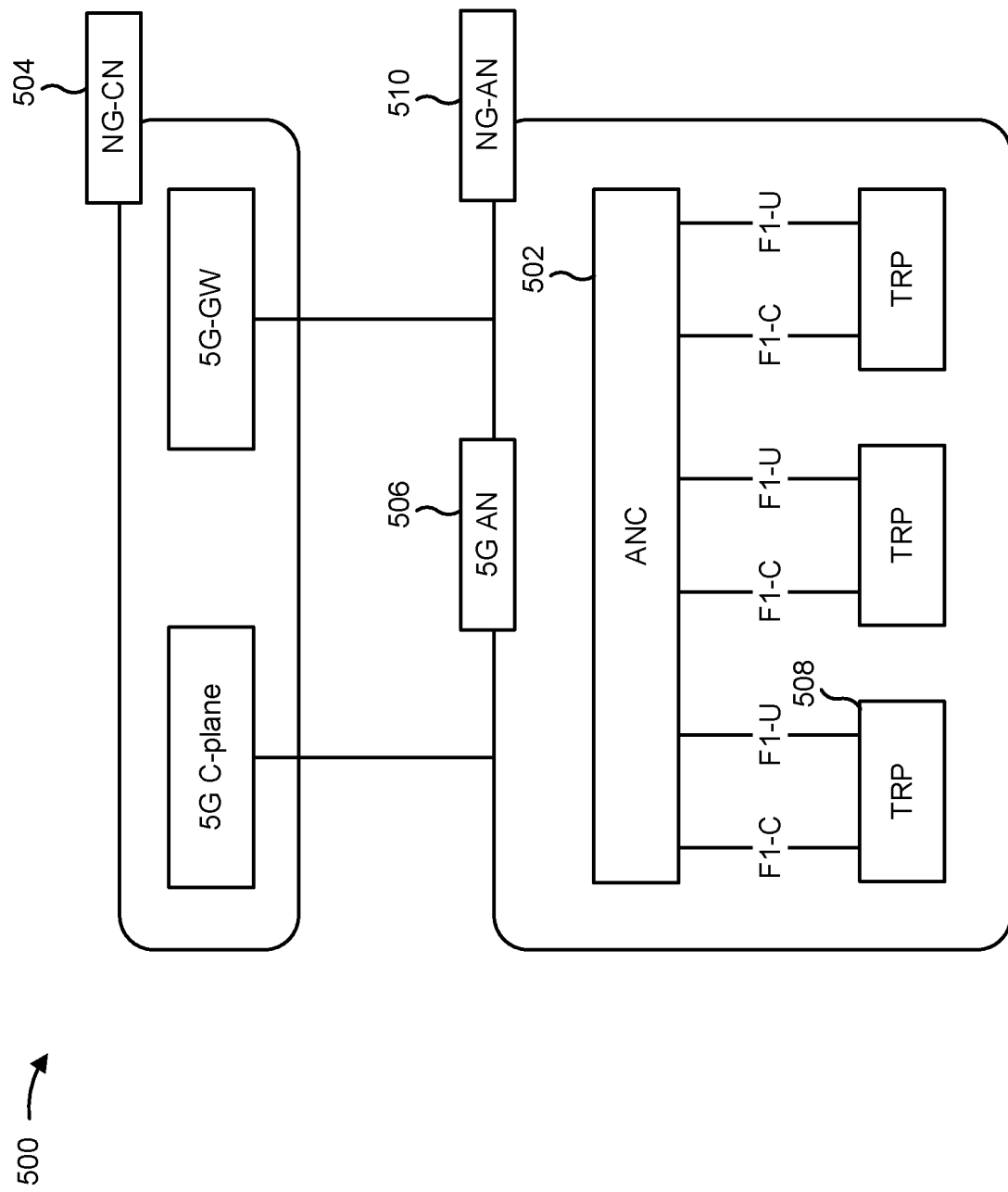
FIG. 5 illustrates an example logical architecture of a distributed radio access network (RAN), in accordance with various aspects of the present disclosure.

FIG. 5 illustrates an example logical architecture of a distributed RAN 500, according to aspects of the present disclosure. A 5G access node 506 may include an access node controller (ANC) 502. The ANC may be a central unit (CU) of the distributed RAN 500. The backhaul interface to the next generation core network (NG-CN) 504 may terminate at the ANC. The backhaul interface to neighboring next generation access nodes (NG-ANs) may terminate at the ANC. The ANC may include one or more TRPs 508 (which may also be referred to as BSs, NR BSs, Node Bs, 5G NBs, APs, gNB, or some other term). As described above, a TRP may be used interchangeably with "cell."

The TRPs 508 may be a distributed unit (DU). The TRPs may be connected to one ANC (ANC 502) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture of RAN 500 may be used to illustrate fronthaul definition. The architecture may be defined that support fronthauling solutions across different deployment types. For example, the architecture may be based at least in part on transmit network capabilities (e.g., bandwidth, latency, and/or jitter).

The architecture may share features and/or components with LTE. According to aspects, the next generation AN (NG-AN) 510 may support dual connectivity with NR. The NG-AN may share a common fronthaul for LTE and NR.

The architecture may enable cooperation between and among TRPs 508. For example, cooperation may be preset within a TRP and/or across TRPs via the ANC 502. According to aspects, no inter-TRP interface may be needed/present.

According to aspects, a dynamic configuration of split logical functions may be present within the architecture of RAN 500. The packet data convergence protocol (PDCP), radio link control (RLC), media access control (MAC) protocol may be adaptably placed at the ANC or TRP.

According to various aspects, a BS may include a central unit (CU) (e.g., ANC 502) and/or one or more distributed units (e.g., one or more TRPs 508).

As indicated above, FIG. 5 is provided as an example. Other examples may differ from what is described with regard to FIG. 5.

Figure 6:
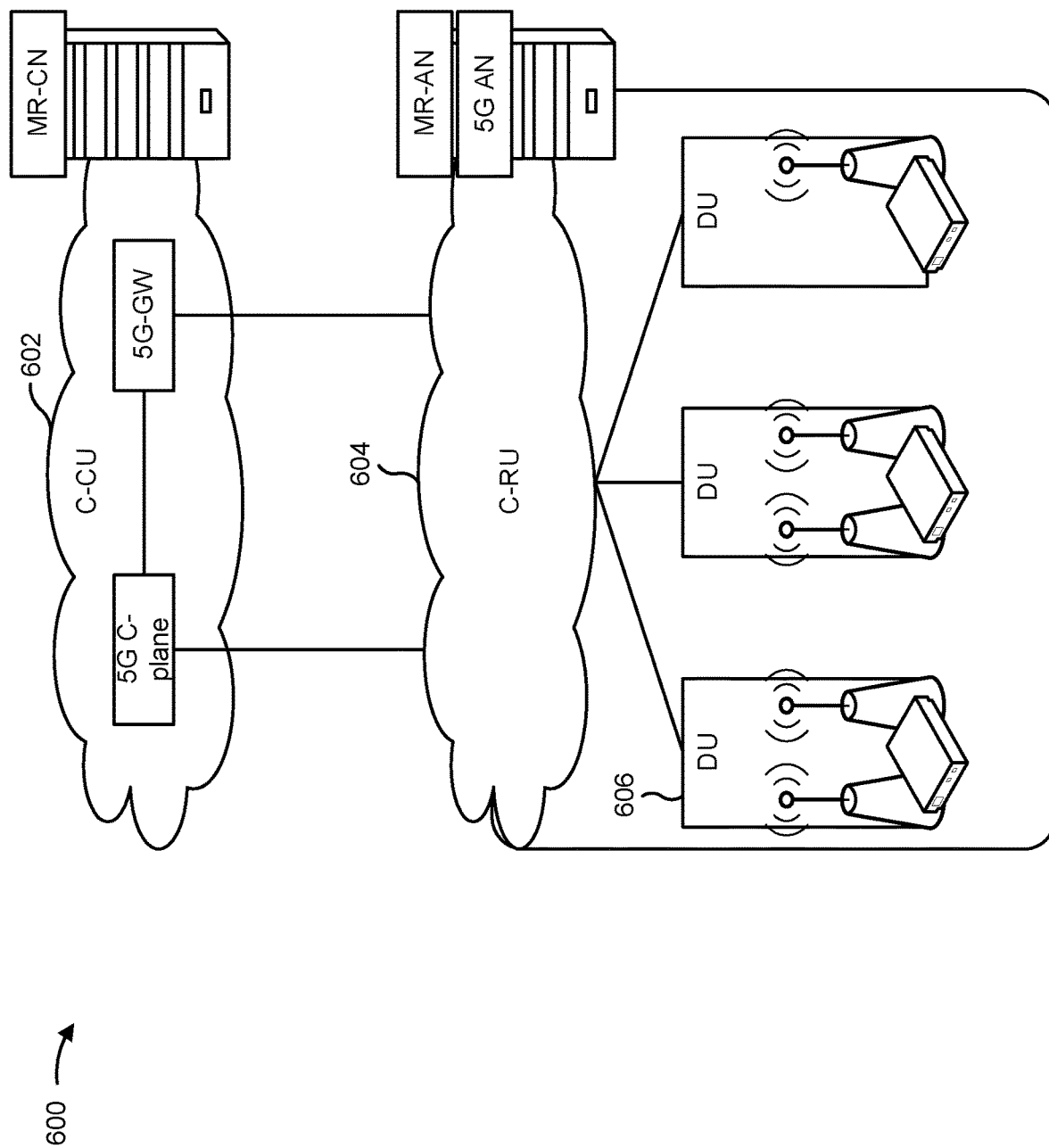
FIG. 6 illustrates an example physical architecture of a distributed RAN, in accordance with various aspects of the present disclosure.

FIG. 6 illustrates an example physical architecture of a distributed RAN 600, according to aspects of the present disclosure. A centralized core network unit (C-CU) 602 may host core network functions. The C-CU may be centrally deployed. C-CU functionality may be offloaded (e.g., to advanced wireless services (AWS)), in an effort to handle peak capacity.

A centralized RAN unit (C-RU) 604 may host one or more ANC functions. Optionally, the C-RU may host core network functions locally. The C-RU may have distributed deployment. The C-RU may be closer to the network edge.

A distributed unit (DU) 606 may host one or more TRPs. The DU may be located at edges of the network with radio frequency (RF) functionality.

As indicated above, FIG. 6 is provided as an example. Other examples may differ from what is described with regard to FIG. 6.

In some communications systems, a UE may be configured to perform a discrete Fourier transform (DFT) on a set of tones (e.g., orthogonal frequency division multiplexing (OFDM) tones) for transmission. The set of tones may have a quantity that satisfies a total size constraint of the form:

$$N = A^\alpha B^\beta C^\gamma = 2^\alpha 3^\beta 5^\gamma$$

where N is the quantity of tones; A, B, and C are size factors corresponding to 2, 3, and 5, respectively; and $\alpha$, $\beta$, and $\gamma$ are non-negative integer values. A UE with a plurality of coherent antennas may perform DFT processing and precoding on all tones and may duplicate the tones to different transmit chains for different coherent antenna ports and associated antennas. Based at least in part on using coherent antenna ports and associated antennas, the UE ensures that transmissions will be at a configured phase offset, thereby ensuring that interference will not occur during uplink DFT waveform transmission at a threshold transmit power. However, when the signals are not offset by the configured phase offset, interference may occur. For UEs with non-coherent antenna ports and associated antennas, transmissions from different antennas may not necessarily be offset by the configured phase offset.

Thus, a UE with a plurality of non-coherent antenna ports and associated antennas may divide tones before DFT processing into a set of decomposition groups that may be separately processed using DFT processing, precoding, resource element mapping, inverse fast Fourier transform (IFFT) processing, waveform generation, and transmission. However, determination of a decomposition group size based at least in part on a fixed split may result in improperly balanced decomposition group sizes, which may reduce transmission throughput.

Some aspects described herein enable DFT size decomposition into a plurality of decomposition groups. For example, the UE may determine a set of sizes for a plurality of decomposition groups based at least in part on one or more decomposition rules, to ensure a balanced decomposition group size or an intentionally unbalanced decomposition group size to account for transmit power differences between different antenna ports and associated antennas. In this case, the UE may map a plurality of tones to the plurality of decomposition groups, thereby enabling separate transmit processing for each group of tones in each decomposition group and enabling transmission without excessive interference, reduction in transmit throughput, and/or the like. Moreover, based at least in part on balancing tones processed using each of a plurality of transmit chains, the UE ensures that a maximum antenna power can be used for each antenna.

Figure 7:
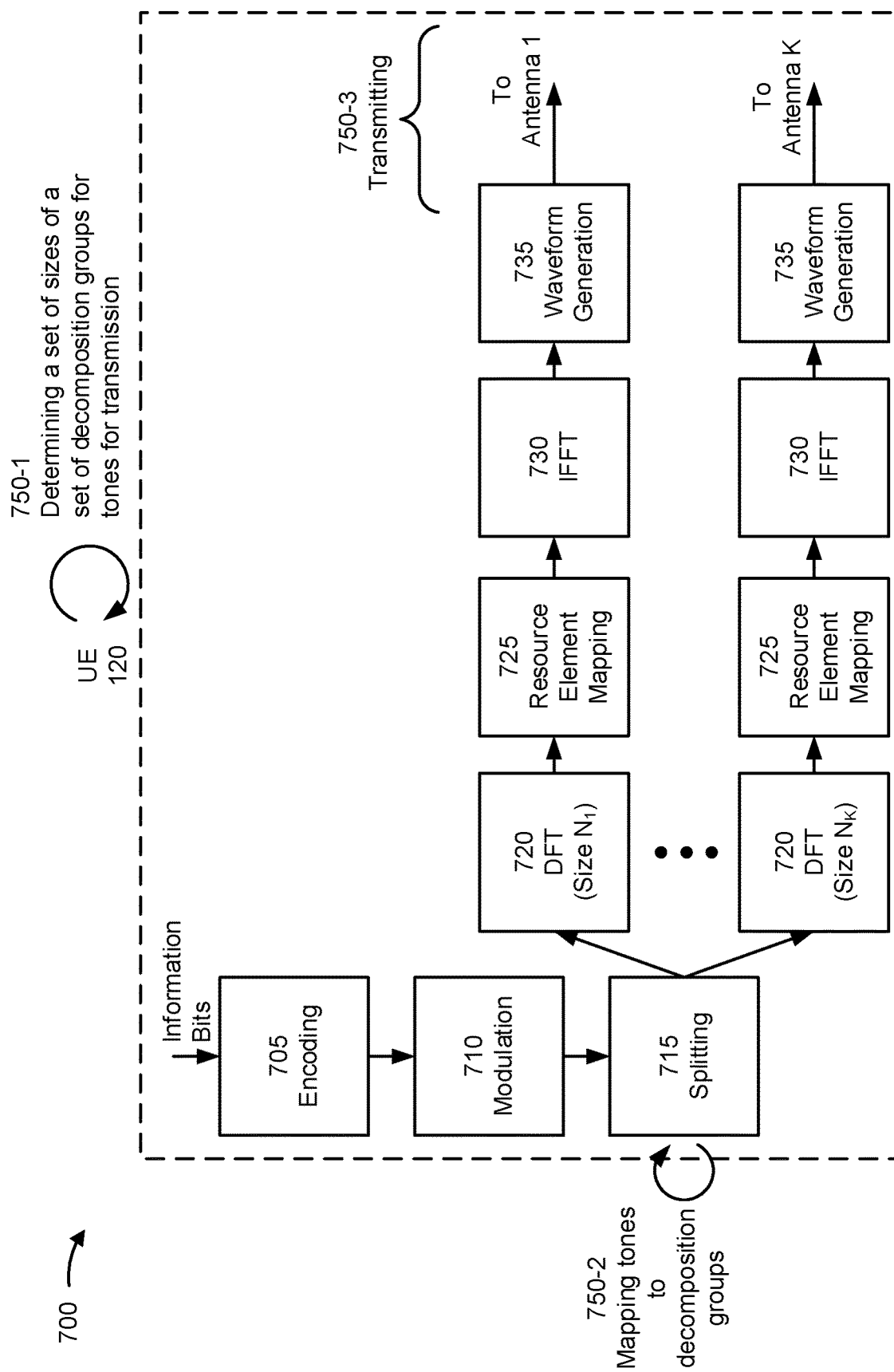
FIG. 7 is a diagram illustrating an example of discrete Fourier transform size decomposition, in accordance with various aspects of the present disclosure.

FIG. 7 is a diagram illustrating an example 700 of DFT size decomposition, in accordance with various aspects of the present disclosure.

As shown in FIG. 7, UE 120 may receive information bits for transmit processing. For example, UE 120 may receive a message for transmission and may perform an encoding procedure 705; a modulation procedure 710; a splitting procedure 715 (as described in more detail herein); DFT procedures 720; resource element mapping procedures 725; IFFT procedures 730; and waveform generation procedures 735 to enable transmission of the information bits.

As further shown in FIG. 7, and by reference number 750-1, to perform splitting procedure 715, UE 120 may determine a set of sizes of a set of decomposition groups into which the tones are to be split for transmission. For example, based at least in part on performing modulation procedure 710, UE 120 may have a plurality of tones to process for transmission and may split the plurality of tones into a set of decomposition groups for separate transmit processing. In this case, UE 120 may determine sizes of the set of decomposition groups based at least in part on one or more decomposition rules.

In some aspects, UE 120 may determine sizes of the set of decomposition groups based at least in part on one or more pre-configured group size factors according to a sequential procedure. For example, when UE 120 is to divide the tones into 2 groups, UE 120 may determine if a quantity of tones N is a multiple of a pre-configured value, 2, and, if so, may divide the tones into a set of 2 groups of size $N_1=q=N_2$ where q is a positive integer. In this case, UE 120 may determine that a total size of the set of decomposition groups is equivalent to a size of a DFT block, which may be the quantity of tones that are to be decomposed for DFT processing:

$$N=N_1+N_2$$

Further, UE 120 may determine that respective sizes of the set of decomposition groups satisfy a size constraint of the DFT block:

$$N=2^\alpha 3^\beta 5^\gamma$$

$$N_1=2^{\alpha-1}3^\beta 5^\gamma$$

$$N_2=2^{\alpha-1}3^\beta 5^\gamma.$$

In other words, N, N1, and N2 are each of the form $A^\alpha B^\beta C^\gamma$ where $\alpha, \beta, \gamma$ are non-negative integers (and where $\alpha-1$ is a non-negative integer that is thereby is of the form of $\alpha$). In this case, in some aspects, the DFT block is divisible by 2, 3, and 5 and each decomposition of the DFT block is similarly divisible by 2, 3, and 5. Finally, UE 120 may determine that a size balancing criterion is satisfied:

$$N_1=N_2.$$

In other words, UE 120 may determine that a quantity of tones that are to be assigned to each decomposition group are assignable in a ratio of 1:1.

In contrast, if UE 120 determines that the quantity of tones is not a multiple of 2, UE 120 may determine whether the quantity of tones is a multiple of another pre-configured value. For example, UE 120 may determine whether N is a multiple of 9, and, if so, may divide N into 2 groups of size $N_1=q*4$ and $N_2=q*5$, resulting in a ratio of 4:5. In this case, UE 120 may determine that:

$$N=2^\alpha 3^\gamma 5^\gamma$$

$$N_1=2^\alpha 3^{\beta-2} 5^\gamma *4$$

$$N_2=2^\alpha 3^{\beta-2} 5^\gamma *5.$$

In contrast, if UE 120 determines that the quantity of tones is not a multiple of 9, UE 120 may determine whether the quantity of tones is a multiple of another pre-configured value. For example, UE 120 may determine whether N is a multiple of 5, and, if so, may divide N into 2 groups of size $N_1=q*2$ and $N_2=q*3$, resulting in a ratio of 2:3. In this case, UE 120 may determine that:

$$N=2^\alpha 3^\gamma 5^\gamma$$

$$N_1=2^\alpha 3^\gamma 5^{\gamma-1}*2$$

$$N_2=2^\alpha 3^{\beta-2} 5^{\gamma-1}*3$$

In contrast, if UE 120 determines that the quantity of tones is not a multiple of 5, UE 120 may determine whether the quantity of tones is a multiple of another pre-configured value. For example, UE 120 may determine whether N is a multiple of 3, and, if so, may divide N into 2 groups of size $N_1=q*1$ and $N_2=q*2$, resulting in a ratio of 1:2. In this case, UE 120 may determine that:

$$N=2^\alpha 3^\beta 5^\gamma$$

$$N_1=2^\alpha 3^{\beta-1} 5^\gamma *1$$

$$N_2=2^\alpha 3^{\beta-1} 5^\gamma *2$$

In some aspects, UE 120 may attempt to divide the tones into groups based at least in part on different pre-configured values in a particular order. For example, UE 120 may first attempt to divide the tones based at least in part on a multiple of 2 to achieve a 1:1 ratio of tones, then may attempt to divide the tones based at least in part on a multiple of 9 to achieve a 4:5 ratio of tones, then may attempt to divide the tones based at least in part on a multiple of 5 to achieve a 2:3 ratio of tones, then may attempt to divide the tones based at least in part on a multiple of 3 to achieve a 1:2 ratio of tones. In this case, the order may be based at least in part on which ratio is closest to 1:1 (e.g., where with respect to closeness (>) to the desired 1:1 ratio, 1:1>4:5>2:3>1:2).

Although some aspects are described herein in terms of a set of determinations, UE 120 may use another technique, such as a lookup table identifying sizes of groups of tones and ratios with which to divide the groups of tones.

As another example, to divide the tones into 4 groups (e.g., for 4 transmit chains for 4 antenna ports), UE 120 may attempt to divide the tones such that $N=N_1+N_2+N_3+N_4$, where each group of size $N_x$ is of the form $2^\alpha 3^\beta 5^\gamma$, and to cause a ratio of $N_1:N_2:N_3:N_4$ to be close to (e.g., within a threshold integer ratio of) 1:1:1:1. For example, UE 120 may determine whether N is a multiple of 4 to cause the groups to have a ratio of 1:1:1:1 and take the form:

$$N_1=N_2=N_3=N_4=2^{\alpha-2}3\gamma 5\gamma.$$

Alternatively, UE 120 may determine whether N is a multiple of 9 to cause the groups to have a ratio of 2:2:2:3 and take the form:

$$N_1=N_2=N_3=2^\alpha 3^{\beta-2} 5^\gamma *2$$

$$N_4=2^\alpha 3^{\beta-2} 5^\gamma *3.$$

Alternatively, UE 120 may determine whether N is a multiple of 5 to cause the groups to have a ratio of 1:1:1:2 and take the form:

$$N_1=N_2=N_3=2^\alpha 3^\beta 5^{\gamma-1}*1$$

$$N_4=2^\alpha 3^\beta 5^{\gamma-1}*2.$$

Alternatively, UE 120 may determine whether N is a multiple of 6 to cause the groups to have a ratio of 1:1:2:2 and take the form:

$$N_1 = N_2 = 2^{\alpha-1} 3^{\beta-1} 5^{\gamma} * 1$$

$$N_3 = N_4 = 2^{\alpha-1} 3^{\beta-1} 5^{\gamma} * 2.$$

In this case, the order of multiples may be based at least in part on which ratio is closest to 1:1:1:1 (e.g., where with respect to closeness to the desired 1:1:1:1 ratio, 1:1:1:1 is closer than 2:2:2:3 is closer than 1:1:1:2 is closer than 1:1:2:2).

As another example, when antenna ports are associated with unbalanced power amplifier values, UE 120 may use a different set and/or order of pre-configured values to determine a set of decomposition values. For example, for a first antenna with a power amplifier value of 23 decibel-milliwatts (dBm) and a second power amplifier with a value of 20 dBm, UE 120 may attempt to determine decomposition group sizes with a ratio of 1:2 rather than 1:1. In this case, UE 120 may determine whether N is a multiple of 3, to attempt to divide the decomposition groups into a ratio of 1:2. Alternatively, UE 120 may determine whether N is a multiple of 5 to attempt to divide decomposition groups into a ratio of 2:3. Alternatively, UE 120 may determine whether N is a multiple of 2 to attempt to divide decomposition groups into a ratio of 1:1 (e.g., where with respect to closeness to the desired 1:2 ratio, 1:2 is closer than 2:3 is closer than 1:1).

In some aspects, UE 120 may determine that the tones cannot be divided based at least in part on a pre-configured value. For example, UE 120 may determine that a group of 3 tones cannot be divided into 4 groups. In this case, UE 120 may alter a quantity of groups into which the tones are divided (e.g., UE 120 may use only 3 of 4 available transmit chains, thereby enabling UE 120 to divide the 3 tones into 3 groups).

In some aspects, UE 120 may generate a plurality of sets of candidate decomposition group sizes, and may select a particular set of decomposition group sizes based at least in part on a selection factor. For example, UE 120 may divide a group of N tones into sets of groups $(N_{1\_m}, N_{2\_m}, \ldots N_{k\_m})$. In this case, UE 120 may select a particular group, of the sets of groups, to minimize a standard deviation for $N_{1\_m}, N_{2\_m}, \ldots, N_{k\_m}$ (e.g., to maximize a closeness of a ratio of $N_{1\_k}:N_{2\_k}: \ldots :N_{i\_k}$ to 1:1:1:1).

Additionally, or alternatively, UE 120 may apply a normalization procedure to the groups. For example, UE 120 may normalize each mth group $(N_{1\_m}, N_{2\_m}, N_{3\_m}, \ldots, N_{k\_m})$ to form normalized group $(N_{1'\_m}, N_{2'\_m}, N_{3'\_m}, \ldots, N_{k'\_m})$ where $N_{1'\_m} = N_{i\_m}/N_{<min\_m>}$ and $N_{<min\_m>} = \text{minimum}(N_{1\_m}, N_{2\_m}, N_{3\_m}, \ldots, N_{k\_m})$. In this case, after the normalization, UE 120 may determine the index m with a smallest standard deviation of the corresponding normalized group $(N_{1'\_m}, N_{2'\_m}, N_{3'\_m}, \ldots, N_{k'\_m})$ and may select the group that corresponds to the normalized group.

In some aspects, UE 120 may select a set of decomposition group sizes based at least in part on a ratio of antenna power amplifier values. For example, after forming normalization groups $(N_{1'\_m}, N_{2'\_m}, N_{3'\_m}, \ldots, N_{k'\_m})$, UE 120 may determine an index m with a smallest difference $d_m$ from (e.g., a maximum closeness to) an antenna port power amplifier ratio $(P_1, P_2, \ldots, P_k)$. In this case, UE 120 may normalize the antenna port power amplifier ratio to $(P_1', P_2', \ldots, P_{k'}) = (P_1, P_2, \ldots, P_k)/P_{<min>}$ where $P_{<min>} = \text{minimum}(P_1, P_2, \ldots, P_k)$. To determine the smallest difference $d_m$, UE 120 may determine one of:

$$d_m = \sum_{k=1}^{K} (P_k' - N_{k,m}')^2 \text{ or}$$

$$d_m = \sum_{k=1}^{K} |P_k' - N_{k,m}'|$$

Although described herein in terms of a particular set of distance calculation equations, other distance calculation equations, lookup tables, and/or the like. In this way, UE 120 may select decomposition group sizes for balanced antenna power amplifier values or unbalanced antenna power amplifier values. For example, when a first antenna port is associated with a power amplifier value of 23 dBm and a second antenna port is associated with a power amplifier value of 20 dBm, UE 120 may attempt to determine a smallest difference between a ratio of decomposition group sizes and a power amplifier value ratio of 1:2 (which may correspond to a 23 dBm to 20 dBm ratio).

In some aspects, UE 120 may use another type of iterative process to determine a set of decomposition group sizes. For example, UE 120 may establish a set of evaluation criteria (e.g., that $N = N_1 + N_2 + \ldots N_k$, that each $N_x$ is of the form $2^{\alpha}3^{\beta}5^{\gamma}$, that a ratio of $N_1:N_2: \ldots :N_k$ is a closest ratio to 1:1: ... :1 of possible decomposition group sizes that have not yet been eliminated by some other criterion, and/or the like), and may check possible decomposition group sizes iteratively until the set of evaluation criteria are satisfied.

As further shown in FIG. 7, and by reference number 750-2, to enable transmit processing using a plurality of transmit chains (e.g., procedures 720-735), UE 120 may map the tones to the set of decomposition groups in accordance with the sizes of the set of decomposition groups. For example, UE 120 may split the tones into decomposition groups associated with different transmit chains according to a determined ratio and/or size of each decomposition group. In this way, UE 120 enables transmit processing using the plurality of transmit chains to account for non-coherence of antenna ports and associated antennas of UE 120.

As further shown in FIG. 7, and by reference number 750-3, after performing transmit processing on groups of tones of the set of decomposition groups, UE 120 may transmit the tones. For example, UE 120 may use a plurality of non-coherent antennas to transmit a plurality of waveforms generated based at least in part on the groups of tones of the set of decomposition groups. In some aspects, UE 120 may control a power amplifier value for one or more antenna ports and associated antennas. For example, when UE 120 determines decomposition group sizes associated with an unbalanced ratio (e.g., 1:2, 2:2:2:3, and/or the like as described above), UE 120 may control power amplifier values to account for the different decomposition group sizes (and different quantities of tones that are to be transmitted by each antenna port and associated antenna).

As indicated above, FIG. 7 is provided as an example. Other examples may differ from what is described with respect to FIG. 7.

Figure 8:
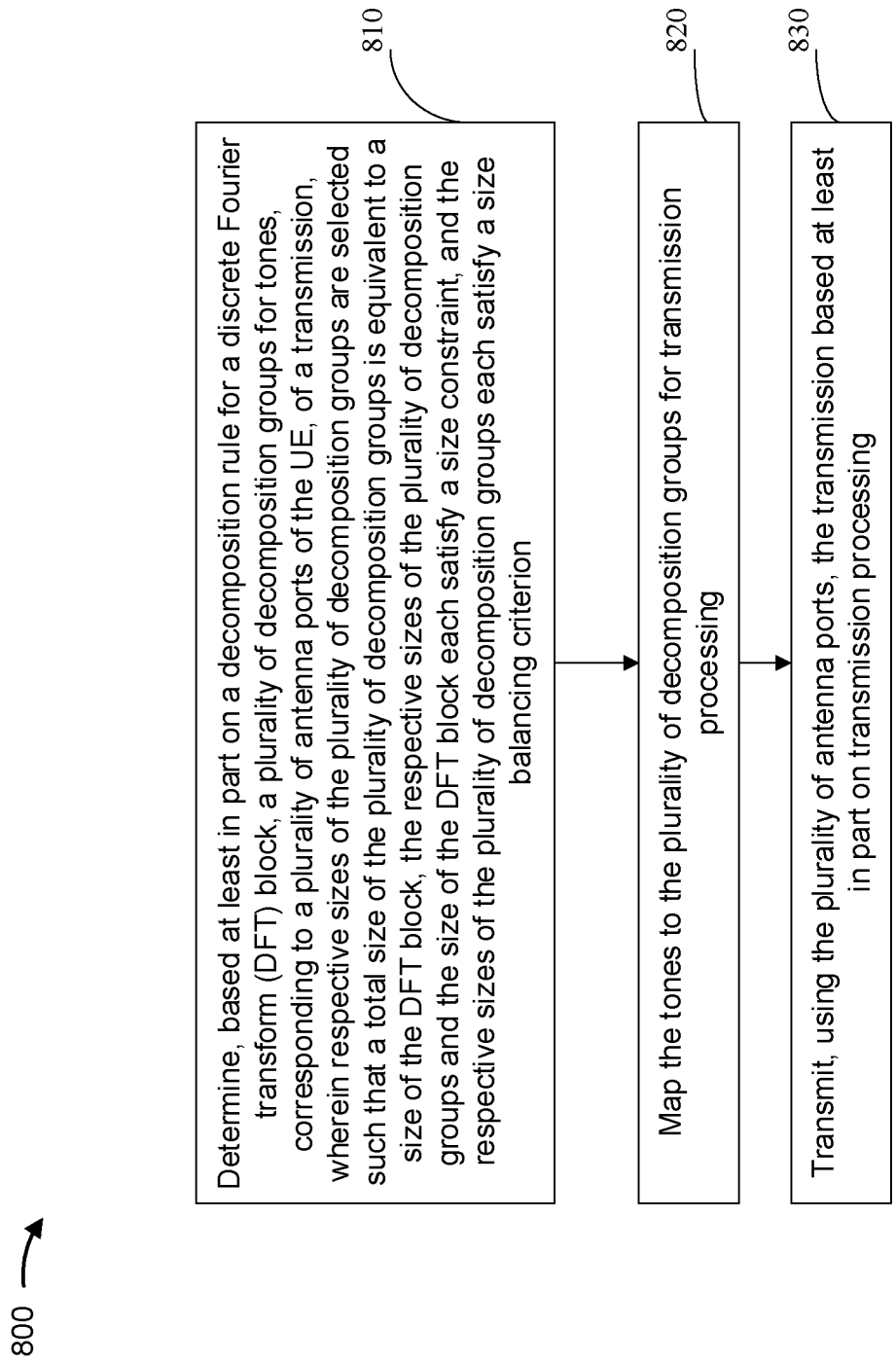
FIG. 8 is a diagram illustrating an example process performed, for example, by a user equipment, in accordance with various aspects of the present disclosure.

FIG. 8 is a diagram illustrating an example process 800 performed, for example, by a UE, in accordance with various aspects of the present disclosure. Example process 800 is an example where a UE (e.g., UE 120 and/or the like) performs operations associated with discrete Fourier transform size decomposition.

As shown in FIG. 8, in some aspects, process 800 may include determining, based at least in part on a decomposition rule for a discrete Fourier transform (DFT) block, a plurality of decomposition groups for tones, corresponding to a plurality of antenna ports of the UE, of a transmission wherein respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion (block 810). For example, the UE (e.g., using receive processor 258, transmit processor 264, controller/processor 280, memory 282, and/or the like) may determine, based at least in part on a decomposition rule for a DFT block, a plurality of decomposition groups for tones, corresponding to a plurality of antenna ports of the UE, of a transmission, as described above in connection with FIG. 7. In some aspects, respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion.

In a first aspect, the plurality of antenna ports correspond to a plurality non-coherent antennas.

In a second aspect, alone or in combination with the first aspect, the size constraint is defined based at least in part on an equation: $N=A^{\alpha}*B^{\beta}*C^{\gamma}$, where N is a particular size that satisfies the size constraint, A, B, and C are size factors, and $\alpha$, $\beta$, $\gamma$ are non-negative integers.

In a third aspect, alone or in combination with one or more of the first and second aspects, the size constraint is defined based at least in part on an equation: $N=2^{\alpha}*3^{\beta}*5^{\gamma}$, where N is a particular size that satisfies the size constraint and $\alpha$, $\beta$, $\gamma$ are non-negative integers.

In a fourth aspect, alone or in combination with one or more of the first through third aspects, determining the plurality of decomposition groups includes determining whether a particular size that satisfies the size constraint is a multiple of a pre-configured group size factor.

In a fifth aspect, alone or in combination with one or more of the first through fourth aspects, the size balancing criterion is related to a quantity of decomposition groups of the plurality of decomposition groups.

In a sixth aspect, alone or in combination with one or more of the first through fifth aspects, a difference between the respective sizes of the plurality of decomposition groups satisfies the size balancing criterion.

In a seventh aspect, alone or in combination with one or more of the first through sixth aspects, determining the plurality of decomposition groups comprises: determining a plurality of possible decomposition group results for the plurality of decomposition groups; and selecting a particular possible decomposition group result for the plurality of decomposition groups based at least in part on a standard deviation of the respective sizes of the plurality of decomposition groups for the particular possible decomposition group result. In an eighth aspect, alone or in combination with one or more of the first through seventh aspects, process 800 may include normalizing the particular possible decomposition group result. In some aspects, selecting the particular possible decomposition group result includes selecting the particular possible decomposition group result based at least in part on the standard deviation of the respective sizes of the plurality of decomposition groups for the particular possible decomposition group result after normalizing the particular possible decomposition group result.

In a ninth aspect, alone or in combination with one or more of the first through eighth aspects, process 800 may include determining the plurality of decomposition groups based at least in part on at least one of a set of DFT size ratios or a set of antenna power amplifier ratios.

In a tenth aspect, alone or in combination with one or more of the first through ninth aspects, the set of DFT size ratios is a set of normalized DFT size ratios.

In an eleventh aspect, alone or in combination with one or more of the first through tenth aspects, the set of antenna power amplifier ratios is a set of normalized antenna power amplifier ratios.

In a twelfth aspect, alone or in combination with one or more of the first through eleventh aspects, the size balancing criterion is a balanced size balancing criterion or an unbalanced size balancing criterion.

In a thirteenth aspect, alone or in combination with one or more of the first through twelfth aspects, the plurality of antenna ports are associated with a common power amplifier value or a plurality of different power amplifier values.

In a fourteenth aspect, alone or in combination with one or more of the first through thirteenth aspects, the size balancing criterion is based at least in part on the common power amplifier value or the plurality of different power amplifier values.

As further shown in FIG. 8, in some aspects, process 800 may include mapping the tones to the plurality of decomposition groups for transmission processing (block 820). For example, the UE (e.g., using receive processor 258, transmit processor 264, controller/processor 280, memory 282, and/or the like) may map the tones to the plurality of decomposition groups for transmission processing, as described above in connection with FIG. 7.

As further shown in FIG. 8, in some aspects, process 800 may include transmitting, using the plurality of antenna ports, the transmission based at least in part on transmission processing (block 830). For example, the UE (e.g., using receive processor 258, transmit processor 264, controller/processor 280, memory 282, and/or the like) may transmit, using the plurality of antenna ports, the transmission based at least in part on transmission processing, as described above in connection with FIG. 7.

Process 800 may include additional aspects, such as any single aspect or any combination of aspects described above and/or in connection with one or more other processes described elsewhere herein.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, and/or the like.

It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a user equipment (UE), comprising:
determining, based at least in part on a decomposition rule for a discrete Fourier transform (DFT) block, a plurality of decomposition groups for tones, corresponding to a plurality of antenna ports of the UE, of a transmission,
wherein respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion;
mapping the tones to the plurality of decomposition groups for transmission processing; and
transmitting, using the plurality of antenna ports, the transmission based at least in part on transmission processing.

2. The method of claim 1, wherein the plurality of antenna ports correspond to a plurality non-coherent antennas.

3. The method of claim 1, wherein the size constraint is defined based at least in part on an equation:
$N=A^{\alpha}*B^{\beta}*C^{\gamma}$, where N is a particular size that satisfies the size constraint, A, B, and C are size factors, and $\alpha$, $\beta$, $\gamma$ are non-negative integers.

4. The method of claim 1, wherein the size constraint is defined based at least in part on an equation:
$N=2^{\alpha}*\beta^{\beta}*5^{\gamma}$, where N is a particular size that satisfies the size constraint and $\alpha$, $\beta$, $\gamma$ are non-negative integers.

5. The method of claim 1, wherein determining the plurality of decomposition groups comprises:
determining whether a particular size that satisfies the size constraint is a multiple of a pre-configured group size factor; and
determining the respective sizes for the plurality of decomposition groups based at least in part on whether the particular size that satisfies the size constraint is the multiple of the pre-configured group size factor.

6. The method of claim 1, wherein the size balancing criterion is related to a quantity of decomposition groups of the plurality of decomposition groups.

7. The method of claim 1, wherein a difference between the respective sizes of the plurality of decomposition groups satisfies the size balancing criterion.

8. The method of claim 1, wherein determining the plurality of decomposition groups comprises:
determining a plurality of possible decomposition group results for the plurality of decomposition groups; and
selecting a particular possible decomposition group result for the plurality of decomposition groups based at least in part on a standard deviation of the respective sizes of the plurality of decomposition groups for the particular possible decomposition group result.

9. The method of claim 8, further comprising:
normalizing the particular possible decomposition group result; and
wherein selecting the particular possible decomposition group result comprises:
selecting the particular possible decomposition group result based at least in part on the standard deviation of the respective sizes of the plurality of decomposition groups for the particular possible decomposition group result after normalizing the particular possible decomposition group result.

10. The method of claim 1, further comprising:
determining the plurality of decomposition groups based at least in part on at least one of a set of DFT size ratios or a set of antenna power amplifier ratios.

11. The method of claim 10, wherein the set of DFT size ratios is a set of normalized DFT size ratios.

12. The method of claim 10, wherein the set of antenna power amplifier ratios is a set of normalized antenna power amplifier ratios.

13. The method of claim 1, wherein the size balancing criterion is a balanced size balancing criterion or an unbalanced size balancing criterion.

14. The method of claim 1, wherein the plurality of antenna ports are associated with a common power amplifier value or a plurality of different power amplifier values.

15. The method of claim 14, wherein the size balancing criterion is based at least in part on the common power amplifier value or the plurality of different power amplifier values.

16. A user equipment (UE) for wireless communication, comprising:
a memory; and
one or more processors operatively coupled to the memory, the memory and the one or more processors configured to:

determine, based at least in part on a decomposition rule for a discrete Fourier transform (DFT) block, a plurality of decomposition groups for tones, corresponding to a plurality of antenna ports of the UE, of a transmission,
wherein respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion;
map the tones to the plurality of decomposition groups for transmission processing; and
transmit, using the plurality of antenna ports, the transmission based at least in part on transmission processing.

17. The UE of claim 16, wherein the plurality of antenna ports correspond to a plurality non-coherent antennas.

18. The UE of claim 16, wherein the size constraint is defined based at least in part on an equation:
$N = A^{\alpha} * B^{\beta} * C^{\gamma}$, where N is a particular size that satisfies the size constraint, A, B, and C are size factors, and $\alpha$, $\beta$, $\gamma$ are non-negative integers.

19. The UE of claim 16, wherein the size constraint is defined based at least in part on an equation:
$N = 2^{\alpha} * 3^{\beta} * 5^{\gamma}$, where N is a particular size that satisfies the size constraint and $\alpha$, $\beta$, $\gamma$ are non-negative integers.

20. The UE of claim 16, wherein the one or more processors, when determining the plurality of decomposition groups, are to:
determine whether a particular size that satisfies the size constraint is a multiple of a pre-configured group size factor; and
determine the respective sizes for the plurality of decomposition groups based at least in part on whether the particular size that satisfies the size constraint is the multiple of the pre-configured group size factor.

21. The UE of claim 16, wherein the size balancing criterion is related to a quantity of decomposition groups of the plurality of decomposition groups.

22. A non-transitory computer-readable medium storing one or more instructions for wireless communication, the one or more instructions comprising:
one or more instructions that, when executed by one or more processors of a user equipment (UE), cause the one or more processors to:
determine, based at least in part on a decomposition rule for a discrete Fourier transform (DFT) block, a plurality of decomposition groups for tones, corresponding to a plurality of antenna ports of the UE, of a transmission,
wherein respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion;
map the tones to the plurality of decomposition groups for transmission processing; and
transmit, using the plurality of antenna ports, the transmission based at least in part on transmission processing.

23. The non-transitory computer-readable medium of claim 22, wherein the plurality of antenna ports correspond to a plurality non-coherent antennas.

24. The non-transitory computer-readable medium of claim 22, wherein the size constraint is defined based at least in part on an equation:
$N = A^{\alpha} * B^{\beta} * C^{\gamma}$, where N is a particular size that satisfies the size constraint, A, B, and C are size factors, and $\alpha$, $\beta$, $\gamma$ are non-negative integers.

25. The non-transitory computer-readable medium of claim 22, wherein the size constraint is defined based at least in part on an equation:
$N = 2^{\alpha} * 3^{\beta} * 5^{\gamma}$, where N is a particular size that satisfies the size constraint and $\alpha$, $\beta$, $\gamma$ are non-negative integers.

26. The non-transitory computer-readable medium of claim 22, wherein the one or more instructions, that cause the one or more processors to determine the plurality of decomposition groups, cause the one or more processors to:
determine whether a particular size that satisfies the size constraint is a multiple of a pre-configured group size factor; and
determine the respective sizes for the plurality of decomposition groups based at least in part on whether the particular size that satisfies the size constraint is the multiple of the pre-configured group size factor.

27. The non-transitory computer-readable medium of claim 22, wherein the size balancing criterion is related to a quantity of decomposition groups of the plurality of decomposition groups.

28. An apparatus for wireless communication, comprising:
means for determining, based at least in part on a decomposition rule for a discrete Fourier transform (DFT) block, a plurality of decomposition groups for tones, corresponding to a plurality of antenna ports of a user equipment (UE), of a transmission,
wherein respective sizes of the plurality of decomposition groups are selected such that a total size of the plurality of decomposition groups is equivalent to a size of the DFT block, the respective sizes of the plurality of decomposition groups and the size of the DFT block each satisfy a size constraint, and the respective sizes of the plurality of decomposition groups each satisfy a size balancing criterion;
means for mapping the tones to the plurality of decomposition groups for transmission processing; and
means for transmitting, using the plurality of antenna ports, the transmission based at least in part on transmission processing.

29. The apparatus of claim 28, wherein the plurality of antenna ports correspond to a plurality non-coherent antennas.

30. The apparatus of claim 28, wherein the size constraint is defined based at least in part on an equation:
$N = A^{\alpha} * B^{\beta} * C^{\gamma}$, where N is a particular size that satisfies the size constraint, A, B, and C are size factors, and $\alpha$, $\beta$, $\gamma$ are non-negative integers.

* * * * *